(12) United States Patent
Waldmann et al.

(10) Patent No.: US 11,485,630 B2
(45) Date of Patent: Nov. 1, 2022

(54) MICROMECHANICAL SENSOR

(71) Applicant: Robert Bosch GmbH, Stuttgart (DE)

(72) Inventors: Jan Waldmann, Reutlingen (DE); Rolf Scheben, Reutlingen (DE); Rudy Eid, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 17/059,729

(22) PCT Filed: Jun. 6, 2019

(86) PCT No.: PCT/EP2019/064772
§ 371 (c)(1),
(2) Date: Nov. 30, 2020

(87) PCT Pub. No.: WO2019/243069
PCT Pub. Date: Dec. 26, 2019

(65) Prior Publication Data
US 2021/0214213 A1    Jul. 15, 2021

(30) Foreign Application Priority Data

Jun. 21, 2018 (DE) .................... 10 2018 210 111.6

(51) Int. Cl.
*G01P 1/02* (2006.01)
*B81B 3/00* (2006.01)
(Continued)

(52) U.S. Cl.
CPC ............ *B81B 3/0081* (2013.01); *G01P 1/006* (2013.01); *G01P 1/023* (2013.01); *G01P 3/44* (2013.01); *G01P 15/125* (2013.01); *B81B 2201/0235* (2013.01); *B81B 2201/0264* (2013.01); *B81B 2203/0315* (2013.01); *G01P 2015/0871* (2013.01)

(58) Field of Classification Search
CPC ..................................................... B81B 3/0081
USPC ..................................................... 73/504.12
See application file for complete search history.

(56) References Cited

U.S. PATENT DOCUMENTS 6,073,490 A * 6/2000 Konovalov ............. G01P 1/006
73/514.31
9,134,337 B2    9/2015 Simoni et al.
(Continued)

FOREIGN PATENT DOCUMENTS

WO    2010034554 A1    4/2010

OTHER PUBLICATIONS

International Search Report for PCT/EP2019/064772, dated Aug. 28, 2019.
(Continued)

Primary Examiner — Walter L Lindsay, Jr.
Assistant Examiner — Philipmarcus T Fadul
(74) Attorney, Agent, or Firm — Norton Rose Fulbright US LLP; Gerard Messina

(57) ABSTRACT

A micromechanical sensor. The sensor includes a substrate, a cap element situated on the substrate, at least one seismic mass that is deflectable orthogonal to the cap element, an internal pressure that is lower by a defined amount relative to the surrounding environment prevailing inside a cavity, and a compensating element designed to provide a homogenization of a temperature gradient field in the cavity during operation of the micromechanical sensor.

10 Claims, 7 Drawing Sheets

(51) Int. Cl.
*G01P 1/00* (2006.01)
*G01P 3/44* (2006.01)
*G01P 15/125* (2006.01)
*G01P 15/08* (2006.01)

(56) References Cited

U.S. PATENT DOCUMENTS

| | | | |
|---|---|---|---|
| 9,476,905 B2 | 10/2016 | Takagi | |
| 2016/0023890 A1* | 1/2016 | Reinmuth | B81B 7/0061 |
| | | | 257/419 |
| 2017/0129768 A1* | 5/2017 | Rusanov | B81B 7/0087 |
| 2018/0031603 A1* | 2/2018 | Huang | G01P 15/14 |

OTHER PUBLICATIONS

Nagel Cristian et al., "Characterization of Temperature Gradients on MEMs Acceleration Sensors," Procedia Engineering, vol. 168, 2017, pp. 888-891.

* cited by examiner

MICROMECHANICAL SENSOR

FIELD

The present invention relates to a micromechanical sensor. The present invention further relates to a method for producing a micromechanical sensor.

BACKGROUND INFORMATION

Micromechanical acceleration sensors are standardly hermetically sealed by wafer bonding, using a cap wafer. This forms a cavity in which a seismic mass of the acceleration sensor can move, and which is filled with one or more gases (e.g., nitrogen, helium, neon, argon, krypton, etc.) at a defined pressure, or defined partial pressures.

Due to their use in thermally complex environments, e.g., in smartphones, wearable electronic devices, or in the engine compartment of machines (e.g., motor vehicles), in acceleration sensors there is frequently a temperature difference between the lower side and upper side of the cavity, in particular in the z direction. From this temperature gradient there results a net movement of the gas molecules in the cavity that occurs both in the case of time-dependent and also stationary temperature gradients. Due to the interaction of the gas molecules with the seismic mass of the acceleration sensor, a zero point error (offset) may occur due to their directed net movement, in particular in the case of z acceleration sensors. This zero point error is a function both of the size of the global temperature gradient over the cavity and also, given non-homogenous temperature distribution over the sensor surface, the local contributions of the temperature gradient field.

Conventionally, modifications of the cap wafer are used to define anchor points for the micromechanical structures, and to compensate torques that are caused by electrostatic forces.

U.S. Pat. No. 9,134,337 B2 describes microelectromechanical out-of-plane stopper elements for MEMS sensors, for protection against impacts.

U.S. Pat. No. 9,476,905 B2 describes a sensor element having a detection electrode, a movable part situated opposite the detection electrode, and a segment that protrudes opposite the movable part, at least one part of the protruding segment being made of an insulating material.

PCT Application No. WO 2010/034554 A1 describes a sensor in which the deflection of the seismic mass is limited by a first and a second stop.

The above-described effect in acceleration sensors is described in the scientific literature, e.g., in C. Nagel et al., "Characterization of Temperature Gradients on MEMS Acceleration Sensors," Procedia Engineering 168 (pp. 888-891), 2016.

SUMMARY

An object of the present invention is to provide a micromechanical sensor having improved fluid-dynamic properties.

According to a first aspect of the present invention, this object may be achieved in accordance with an example embodiment by a micromechanical sensor having:
  a substrate;
  a cap element situated on the substrate; and
  at least one seismic mass that is deflectable orthogonal to the cap element, an inner pressure that is lowered in a defined fashion relative to the surrounding environment prevailing inside a cavity; characterized by
  harmonizing means (i.e., element(s)) that are designed to provide a homogenization of a temperature gradient field in the cavity during operation of the micromechanical sensor.

Here, the harmonizing means (i.e., element(s)) are provided exclusively in order to symmetrize the entire system with regard to fluid dynamics. This can advantageously be achieved by harmonizing fluid-dynamic effects for the deflectable seismic mass. As a result, an improved lack of sensitivity to thermal effects can advantageously be realized for the micromechanical sensor. In this way, it is enabled that the sensor is deflected exclusively due to mechanical inertial forces, and not by force effects produced due to thermal fluid effects.

According to a second aspect of the present invention, the object is achieved by a method for producing a micromechanical sensor, having the steps:
  providing a substrate;
  providing a cap element situated on the substrate; and
  providing at least one seismic mass that is deflectable orthogonal to the cap element, an inner pressure prevailing inside a cavity that is lowered in a defined fashion relative to the surrounding environment; and
  providing harmonizing means that are designed to provide a homogenization of a temperature gradient field in the cavity during operation of the micromechanical sensor.

Preferred developments of the micromechanical sensor are described herein.

In an advantageous development of the micromechanical sensor according to the present invention, the harmonizing means include at least one structuring element of the cap element, a defined distance of the seismic mass from the cap element being provided by the structuring element in defined segments. In this way, the desired effect can be achieved via a simple structuring of the cap element.

In a further advantageous development of the micromechanical sensor in accordance with the present invention, the cap element is lowered and structured in some segments relative to low-mass segments of the seismic mass. In this way, a specific modification of the above-named structuring measure is provided that is easy to provide.

In a further advantageous development of the micromechanical sensor in accordance with the present invention, additional layers are incorporated into the cap element, the layers being fashioned as thermal insulators and/or as thermal conductors. In this way, an additional alternative measure is provided for harmonizing the temperature gradient field.

In a further advantageous development of the micromechanical sensor in accordance with the present invention, a thermally optimized coupling between defined regions of the micromechanical sensor is realized by thermal coupling elements. Preferably, the thermal coupling elements are realized here as thermal vias with which a homogenization of the temperature gradient field inside the cavity of the sensor is achieved.

In a further advantageous development of the micromechanical sensor in accordance with the present invention, the thermal coupling elements include a metal. Due to the very good thermal conductivity of metal, preferably copper or aluminum, an optimized harmonization of the temperature gradient field can be provided by the coupling elements.

In a further advantageous development of the micromechanical sensor in accordance with the present invention, the compensating means (i.e., element) include a defined porosification of materials of the micromechanical sensor. Through the porosification of the materials, thermal radiation into the cap element can advantageously be reduced, and in this way a harmonization of the temperature gradient field can be achieved.

In further advantageous developments of the micromechanical sensor in accordance with the present invention, a degree of symmetry orthogonal to the direction of deflection is increased by a defined amount. Through the degree of symmetry realized in this way, a homogenization of the temperature gradient field inside the cavity can likewise be achieved.

In further advantageous developments of the micromechanical sensor in accordance with the present invention, the sensor is one of the following: acceleration sensor, rotational rate sensor, pressure sensor. In this way, the proposed design can advantageously be realized for different types of micromechanical sensors.

Below, the present invention is described in more detail, with additional features and advantages, on the basis of a plurality of Figures. Identical or functionally identical elements have the same reference characters. The Figures are in particular intended to illustrate the principles essential to the present invention, and are not necessarily true to scale. For clarity, it may be provided that all the reference characters are not indicated in all the Figures.

Disclosed method features result analogously from corresponding disclosed device features, and vice versa. This means in particular that features, technical advantages, and embodiments relating to the method for producing a micromechanical sensor result analogously from corresponding embodiments, features, and advantages relating to the micromechanical sensor, and vice versa.

DETAILED DESCRIPTION OF EXAMPLE EMBODIMENTS

In accordance with the present invention, an improvement of a so-called radiometric design for micromechanical sensors is provided. This is achieved through a symmetrization of fluid-dynamically relevant structures of the sensor, whereby temporal lifting effects in the MEMS structures are minimized that may occur when a source of heat is present.

In this way, undesired changes of sensor parameters, such as output offsets, can advantageously be prevented, or at least minimized.

The named lifting effects occur either, in the case of asymmetrical geometries of the sensor, due to uniformly acting thermal effects, and/or, given symmetrical geometries of the sensor, due to asymmetrically acting thermal effects. Mixed forms of these two variants are also possible.

The present invention provides in particular a reduction or compensation of the thermal zero point error, caused by gas flow, of z acceleration sensors by modification of the temperature gradient field in the cavity of the z acceleration sensor. The modification of the temperature gradient field can be achieved for example through specific constructive modifications of the cap wafer; for the modification, other measures are also provided that can advantageously be suitably combined with one another.

Here, the vector field:

$$g(r) = \left(\frac{dT}{dx}\bigg|_r, \frac{dT}{dy}\bigg|_r, \frac{dT}{dz}\bigg|_r\right)^T$$

is designated as temperature gradient field g; that is, the rate of change of the temperature is evaluated at each point x of the space. The term "temperature gradient" relates to the magnitude and direction of g at a particular location of a sensor cavity (e.g., $g_0 \equiv g(r_0)$ of the temperature gradient at the location $r_0$).

An example embodiment of the present invention provides a thermally active modification of the cap wafer of micromechanical acceleration sensors whose seismic mass is movable perpendicular to the substrate plane, as is the case in particular in z acceleration sensors.

Figure 1:
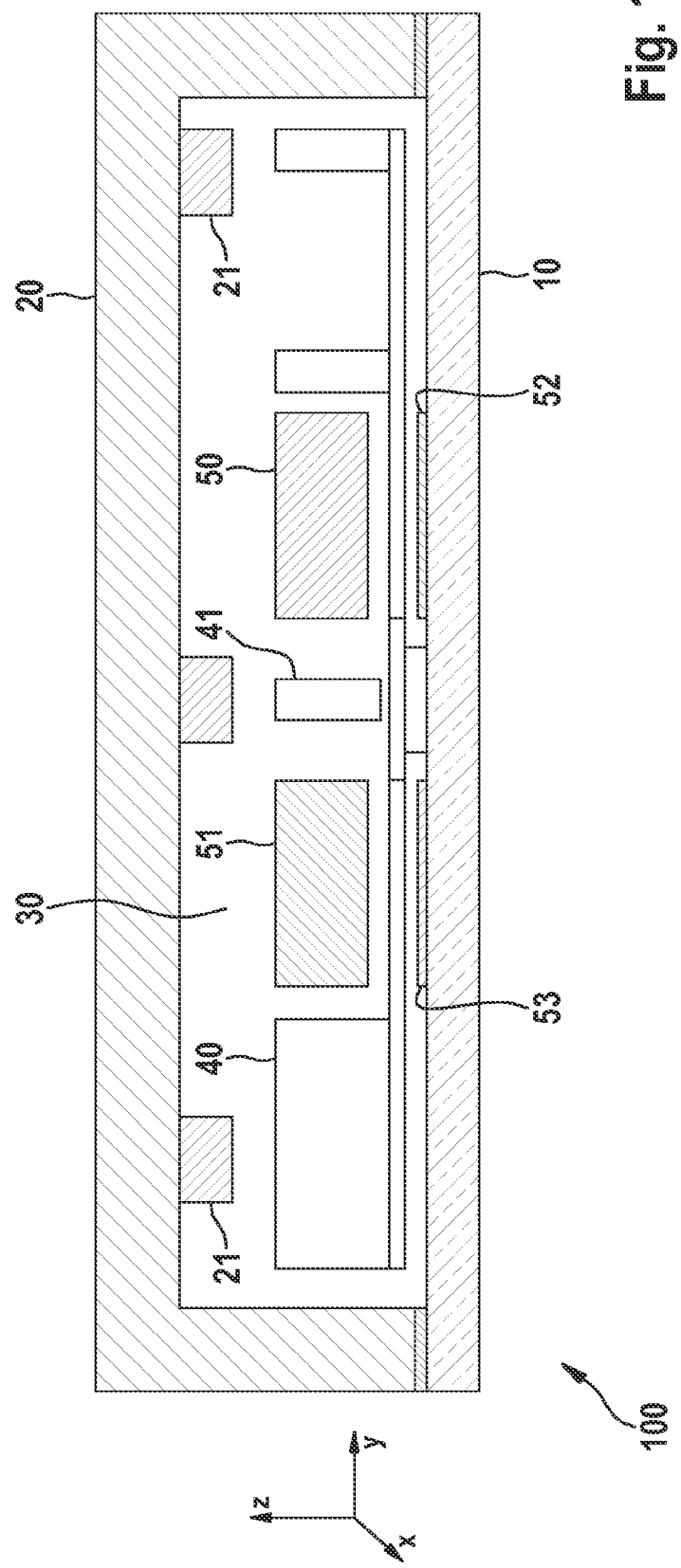
FIG. 1 shows a cross-sectional view of a conventional micromechanical z acceleration sensor.

FIG. 1 shows a cross-sectional view of such a conventional micromechanical z acceleration sensor 100, in which a rocker structure of such a conventional micromechanical z acceleration sensor is particularly susceptible to the named disadvantageous effects.

Shown is a micromechanical acceleration sensor 100 having a substrate 10 and a cap element, or cap wafer, 20 situated thereon. Inside the thereby formed cavity 30, there is situated a movable seismic mass 40 that is mounted so as to be capable of torsion about a torsion axis 41. Deflections of seismic mass 40 are preferably capacitively evaluated by electrodes 50, 51, 52, and 53. Stop elements 21 are provided in order to provide a possibility of stopping seismic mass 40 in case of mechanical overload.

Figure 2:
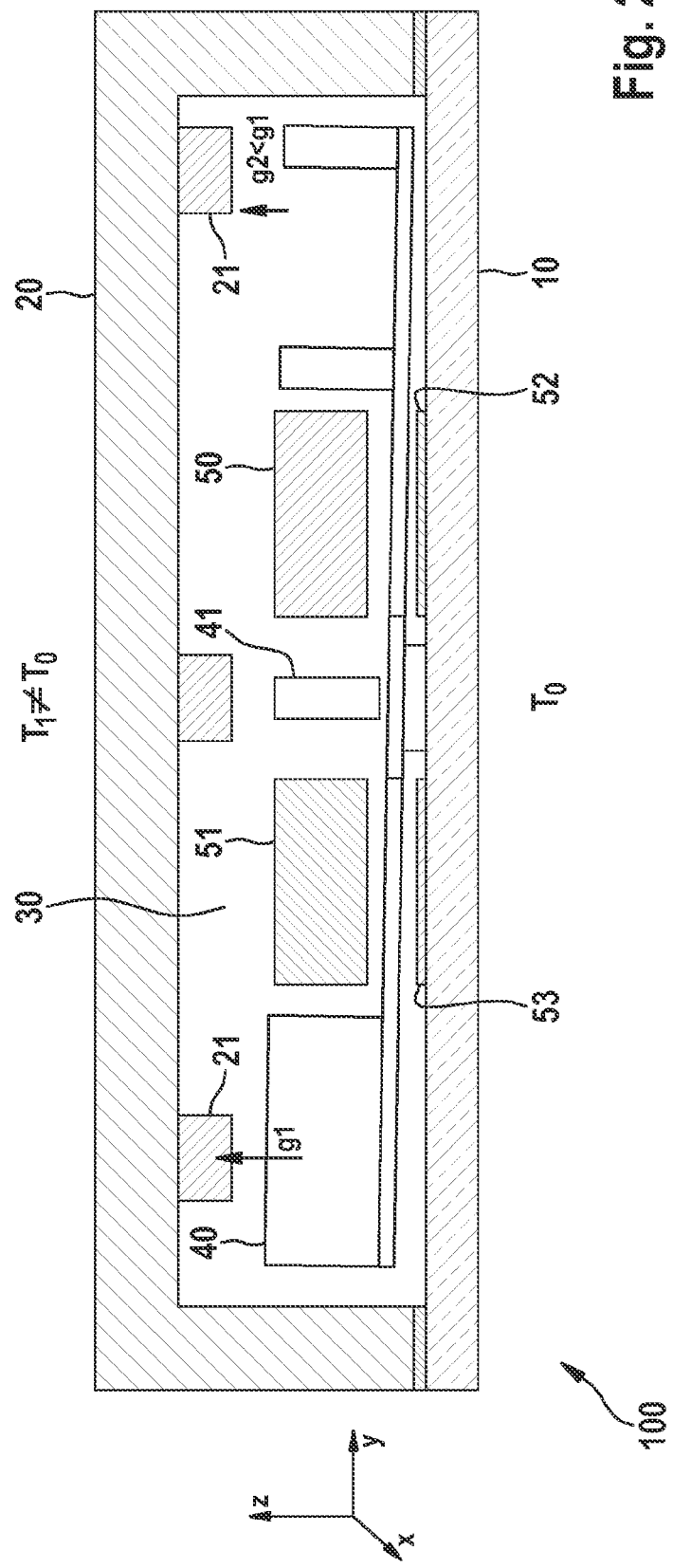
FIG. 2 shows the cross-sectional view of FIG. 1 with indicated temperature gradients inside a cavity.

FIG. 2 shows a cross-sectional view of micromechanical acceleration sensor 100 of FIG. 1, having temperature gradients g1, g2 inside cavity 30. It can be seen that on the left side, in which the portion of seismic mass 40 is higher than on the right side (asymmetrical design of the seismic mass in the form of a so-called "box mass"), a temperature gradient g1 is greater than a temperature gradient g2 on the right side, which is lower in mass.

Figure 3:
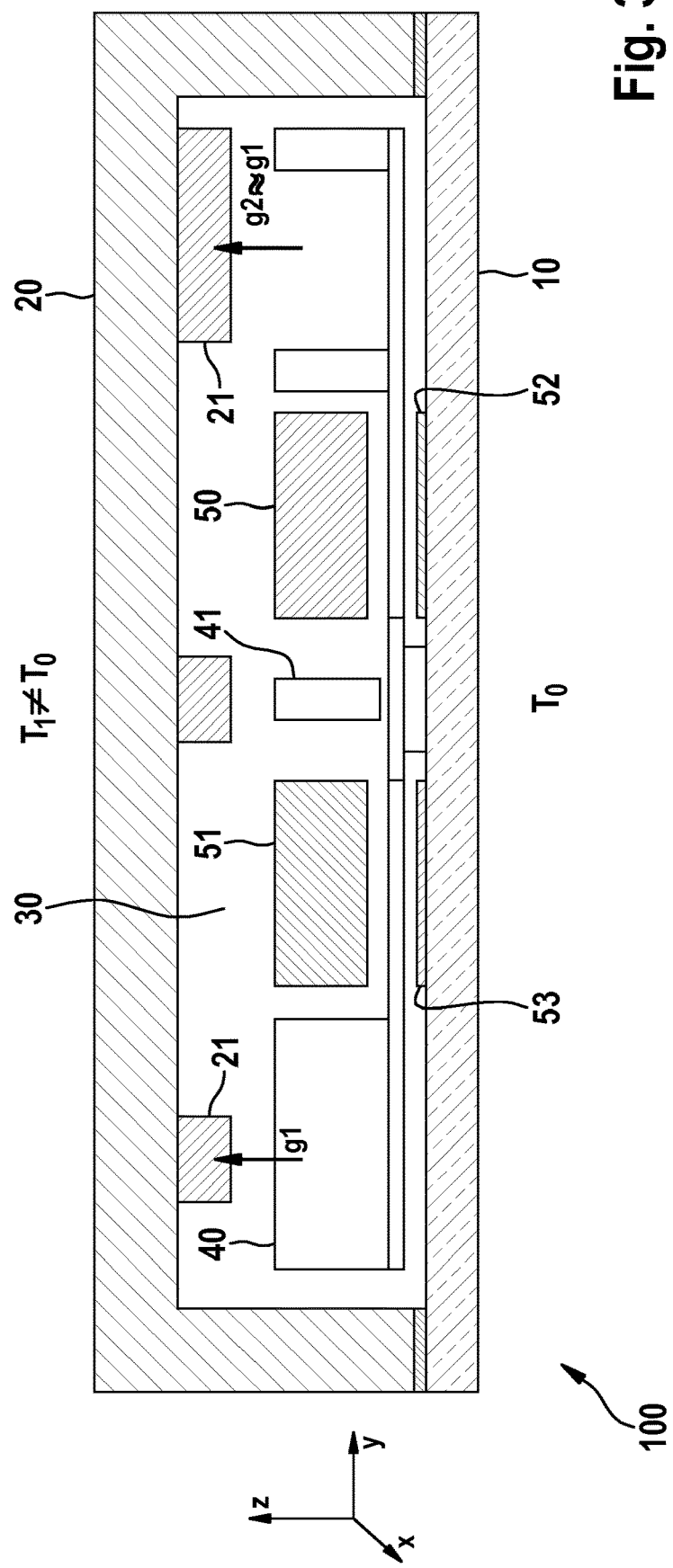
FIG. 3 shows a cross-sectional view of a specific embodiment of a micromechanical sensor, in accordance with the present invention.

In a specific embodiment of micromechanical sensor 100 in accordance with the present invention, it is proposed to specifically modify cap element 20, which is shown in the cross-sectional view of FIG. 3. This is achieved by enlarging or reducing a distance of cap element 20 from seismic mass 40, whereby the temperature gradient is reduced in a locally defined manner, or is increased in a locally defined manner. In addition, through the named cap structuring (for example via variations in thickness), its thermal conductivity can be adapted locally. As a result, with suitable structuring the thermally caused overall torque of the seismic mass 40 can be reduced to approximately zero.

The above-named compensation measure compensates temperature gradients g1 and g2 of sensor 100 of FIG. 2 by adapting the distance between cap element 20 and seismic mass 40 in a locally defined manner so that the torques caused by the gas flow compensate one another to approximately zero, as shown in FIG. 3. In this configuration, the distance between the locally lowered cap element 20 and the lower side of seismic mass 40 is typically approximately 25 μm, at least 20 μm, and at most 30 μm. The distance between the upper side of seismic mass 40 and lowered cap element 20 is typically 2.5 μm, at least 1.5 μm, and at most 5 μm. The distance between the non-lowered cap element 20 and the upper side of seismic mass 40 is typically 30 μm.

It will be seen in FIG. 3 that micromechanical sensor 100 is distinguished in that a degree of symmetry in the y direction (i.e., orthogonal to deflection direction z) has been increased by a defined amount relative to the conventional design shown in FIG. 2.

Figure 4:
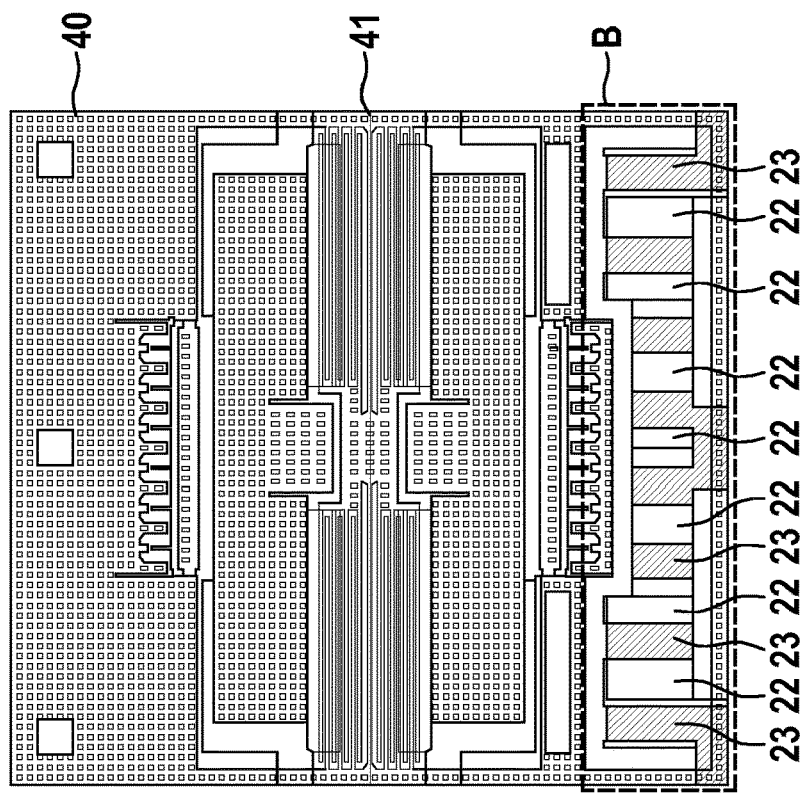
FIG. 4 shows a top view of a specific embodiment of the micromechanical sensor, in accordance with the present invention.

For symmetrical z rockers having cap structurings suitable for box masses are shown in the top view of the proposed micromechanical sensor 100 of FIG. 4. The cap structurings are realized such that cap element 20 is lowered to approximately 30% to approximately 65% of the region B highlighted in broken lines, which is shown as region 23.

This is achieved by regions 23 that, compared to structuring elements 22 in an edge region of low-mass region B of seismic mass 40, are lowered by different distances relative to seismic mass 40. Thus, in region 23 the distance between cap element 20 and seismic mass 40 is smaller than a distance between the remaining portion of cap element 20 and seismic mass 40.

Of course, all numerical indications are given only as examples.

Figure 5:
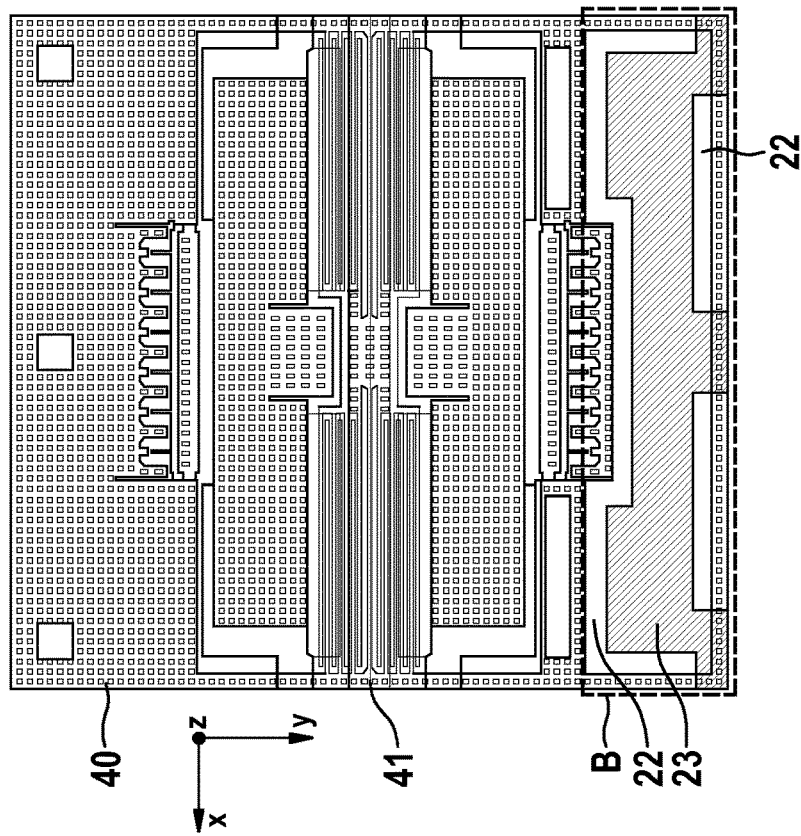
FIG. 5 shows a top view of a further specific embodiment of the micromechanical sensor, in accordance with an example embodiment of the present invention.

FIG. 5 shows a top view of a further specific embodiment of a proposed micromechanical sensor 100. In this case, in comparison with the configuration of FIG. 4, region 23 has been structured more strongly by structuring elements 22, i.e., lowered relative to seismic mass 40, whereby temperature gradient g2 can be set in a defined manner.

In addition, the temperature gradient field can also be locally modified via a local modification of the thermal conductivity of cap element 20. With this measure, temperature gradients g1 and g2 of sensor 100 of FIG. 2 can be compensated by locally modifying the thermal conductivity of cap element 20, for example through a metallization with aluminum, copper, titanium, passivation of the surface using silicon oxide or silicon nitride, partial porosification of the silicon or locally strongly increased doping material concentrations in the silicon, as is shown schematically in the cross-sectional view of FIG. 6.

It will be seen that the surface of cap element 20 is provided in some segments with a thermal insulator 60 and with a thermal conductor 70, in order to balance the temperature gradients g1, g2 at both sides of torsion axis 41.

Figure 6:
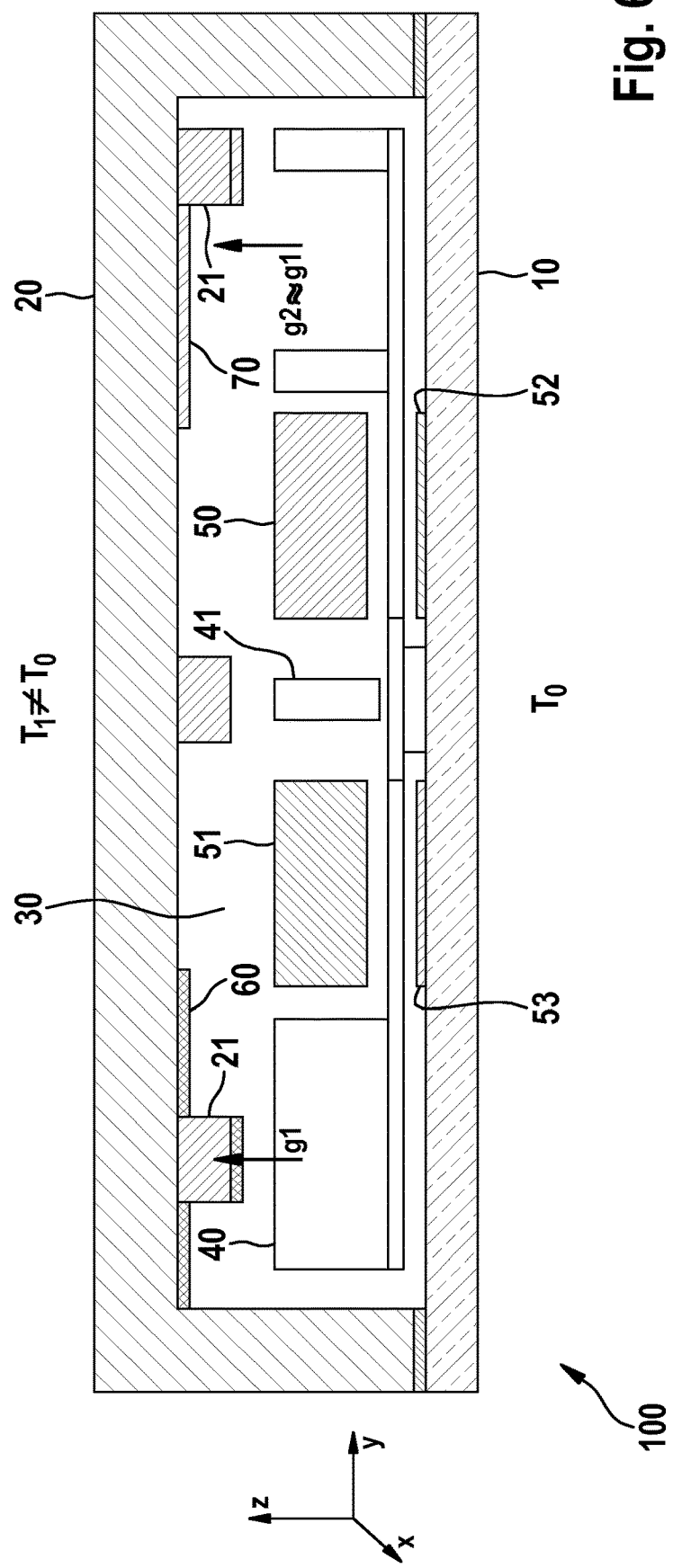
FIG. 6 shows a cross-sectional view of a further embodiment of the micromechanical sensor, in accordance with an example embodiment of the present invention.

Through the thereby achieved locally different thermal conductivity of cap element 20, the temperature profile on its surface changes towards seismic mass 40. A precise setting of this temperature profile permits a balancing of the temperature gradients at both sides of seismic mass 40, as is indicated in FIG. 6 for a seismic mass 40 in the form of an asymmetrical z rocker.

Figure 7:
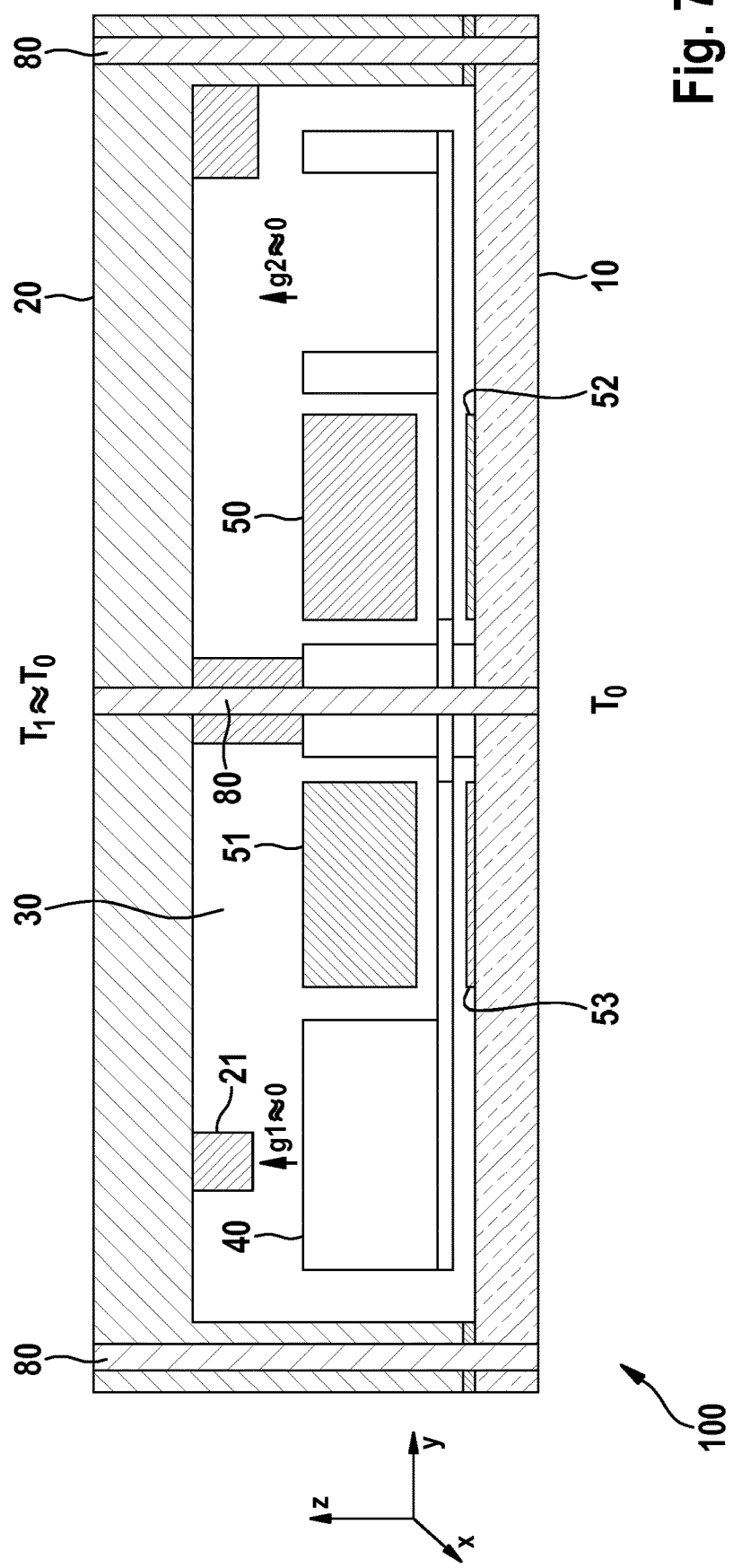
FIG. 7 shows a cross-sectional view of a further specific embodiment of the proposed micromechanical sensor, in accordance with an example embodiment of the present invention.

In a further specific embodiment of the proposed micromechanical sensor 100, it is provided to compensate temperature differences between the lower side and upper side of cavity 30 through thermal through-silicon vias (TTSVs), or coupling elements 80. This compensation measure has the aim of bringing it about that the temperatures of substrate 10, seismic mass 40, and cap element 20 are approximately equal in magnitude independent of the surrounding environment. This is achieved by copper-filled or aluminum-filled thermal coupling elements 80 that are fashion for example inside substrate 10 and/or inside movable seismic mass 40 and/or inside cap element 20, and that connect substrate 10 to cap element 20 and/or connect substrate 10 to seismic mass 40, and/or extend through the overall layer stack 10, 20, 40. A schematic cross-sectional view of such a micromechanical sensor 100 is shown in FIG. 7.

Of course, all compensation measures explained above can also be combined with one another in any desired manner in order to achieve an optimization of the effect of the compensation of the temperature gradient field.

The preceding detailed description of the measure according to the present invention was made with reference to a typical z acceleration sensor for automotive applications. However, it is also possible that the proposed measure be used for other encapsulated sensors, not shown in Figures, that have movable micromechanical elements and that have an internal pressure differing from the ambient pressure.

The present invention can advantageously be realized for all micromechanical sensors having movable elements enclosed in a cap below a defined internal pressure. For example, the present invention can be realized for pressure sensors having a movable membrane, for acceleration sensors, rotational rate sensors, etc.

Dynamic effects that occur due to the fact that different temperatures or temperature gradients are present at the rocker between the upper side and lower side, and gas flows are generated in the sensor, can thereby be advantageously symmetrized. As a result, a tilting of the rocker due to thermal effects is at least reduced, and is ideally completely avoided.

An offset behavior of a z inertial sensor designed in this way can be significantly improved as a result.

Figure 8:
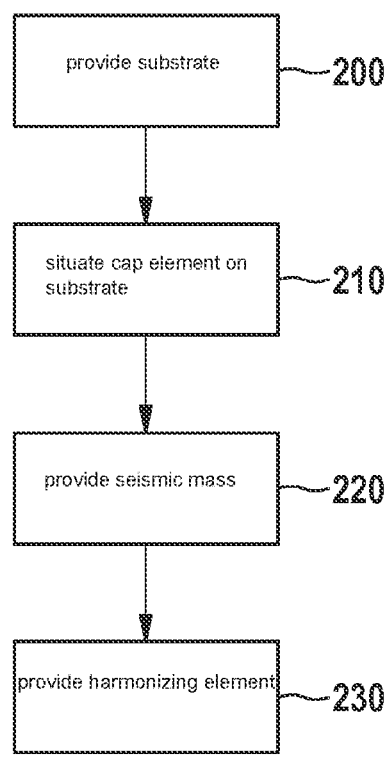
FIG. 8 shows a schematic sequence of a method for producing a micromechanical sensor, in accordance with an example embodiment of the present invention.

FIG. 8 shows a schematic sequence of the proposed method for producing a micromechanical sensor 100, in accordance with an example embodiment of the present invention.

In a step 200, a substrate 10 is provided.

In a step 210, a cap element 20 situated on substrate 10 is provided.

In a step 220, at least one seismic mass 40 that is deflectable orthogonal to cap element 20 is provided, an internal pressure that is lower by a defined amount relative to the surrounding environment being provided inside a cavity 30.

In a step 230, harmonizing means are provided that are designed to provide a homogenization of a temperature gradient field in cavity 30 during operation of micromechanical sensor 100.

Of course, the sequence of the named steps may also be exchanged in a suitable manner.

Although the present invention has been described above on the basis of specific exemplary embodiments, the person skilled in the art may also realize specific embodiments not disclosed, or only partly disclosed, without departing from the core of the present invention.

What is claimed is:

1. A micromechanical sensor, comprising:
a substrate;
a cap element situated on the substrate;
at least one seismic mass that is deflectable orthogonal to the cap element, an internal pressure that is lower by a defined amount relative to a surrounding environment prevailing inside a cavity; and a compensating element that is configured to provide a homogenization of a temperature gradient field in the cavity during operation of the micromechanical sensor, wherein the compensating element includes at least one structuring element of the cap element, wherein a thermally optimized coupling between defined regions of the micromechanical sensor is realized by thermal coupling elements.

2. The micromechanical sensor as recited in claim 1, wherein the compensating element includes a defined porosification of materials of the micromechanical sensor.

3. The micromechanical sensor as recited in claim 1, wherein a degree of symmetry orthogonal to the deflection direction is increased by a defined amount.

4. The micromechanical sensor as recited in claim 1, wherein the sensor is one of the following: acceleration sensor, rotational rate sensor, pressure sensor.

5. A micromechanical sensor, comprising:
a substrate;
a cap element situated on the substrate;
at least one seismic mass that is deflectable orthogonal to the cap element, an internal pressure that is lower by a defined amount relative to a surrounding environment prevailing inside a cavity; and
a compensating element that is configured to provide a homogenization of a temperature gradient field in the cavity during operation of the micromechanical sensor,
wherein the compensating element include at least one structuring element of the cap element, a defined distance of the seismic mass to the cap element being provided in defined segments by the structuring element.

6. The micromechanical sensor as recited in claim 5, wherein additional layers are incorporated into the cap element, the layers being thermal insulators and/or thermal conductors.

7. The micromechanical sensor as recited in claim 5, wherein a thermally optimized coupling between defined regions of the micromechanical sensor is realized by thermal coupling elements.

8. The micromechanical sensor as recited in claim 7, wherein the thermal coupling elements include a metal.

9. A micromechanical sensor, comprising:
a substrate;
a cap element situated on the substrate;
at least one seismic mass that is deflectable orthogonal to the cap element, an internal pressure that is lower by a defined amount relative to a surrounding environment prevailing inside a cavity; and
a compensating element that is configured to provide a homogenization of a temperature gradient field in the cavity during operation of the micromechanical sensor,
wherein the cap element is lowered and structured in some segments relative to low-mass segments of the seismic mass.

10. A method for producing a micromechanical sensor, comprising the following steps:
providing a substrate;
providing a cap element situated on the substrate;
providing at least one seismic mass that is deflectable orthogonal to the cap element, an internal pressure that is increased by a defined amount relative to a surrounding environment prevailing inside a cavity; and
providing a harmonizing element that is configured to provide a homogenization of a temperature gradient field in the cavity during operation of the micromechanical sensor, wherein the harmonizing element includes at least one structuring element of the cap element,
wherein a thermally optimized coupling between defined regions of the micromechanical sensor is realized by thermal coupling elements.

* * * * *